(12) United States Patent
Figueroa et al.

(10) Patent No.: US 6,545,346 B2
(45) Date of Patent: Apr. 8, 2003

(54) INTEGRATED CIRCUIT PACKAGE WITH A CAPACITOR

(75) Inventors: David G. Figueroa, Mesa, AZ (US); Debendra Mallik, Chandler, AZ (US); Jorge Pedro Rodriguez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/816,665

(22) Filed: Mar. 23, 2001

(65) Prior Publication Data

US 2002/0135053 A1 Sep. 26, 2002

(51) Int. Cl.[7] .............................. H01L 23/02; H01G 4/06
(52) U.S. Cl. ........................ 257/678; 257/703; 257/685; 361/321.2
(58) Field of Search .......................... 257/71, 296, 298, 257/300, 301, 303, 306–309, 312, 313, 516, 531, 532, 697, 698, 700, 703, 724, 728, 778, 906, 908, 924, 678, 684, 686, 687, 688, 689, 690, 693, 735; 361/268, 271, 734, 301.4, 313, 761, 321.2, 307, 308.1; 174/255; 29/852, 854, 25, 42

(56) References Cited

U.S. PATENT DOCUMENTS

| 5,177,670 | A | * | 1/1993 | Shinohara et al. ........... 361/738 |
| 5,556,811 | A | | 9/1996 | Agatstein et al. ............ 437/209 |
| 5,590,016 | A | * | 12/1996 | Fujishiro et al. ............. 361/313 |
| 5,712,758 | A | * | 1/1998 | Amano et al. ............ 361/321.2 |
| 5,923,086 | A | | 7/1999 | Winer et al. .................. 257/713 |
| 6,031,283 | A | | 2/2000 | Banerjee et al. ............. 257/698 |
| 6,058,004 | A | * | 5/2000 | Duva et al. ............... 361/301.4 |
| 6,098,282 | A | * | 8/2000 | Frankeny et al. .............. 29/852 |
| 6,177,670 | B1 | * | 1/2001 | Shinohara et al. ........... 257/697 |
| 6,366,444 | B1 | * | 4/2002 | Yagi ......................... 361/321.2 |
| 6,381,118 | B1 | * | 4/2002 | Yokoyama et al. ....... 361/308.1 |
| 6,452,781 | B1 | * | 9/2002 | Ahiko et al. .............. 361/321.2 |
| 2001/0010398 | A1 | * | 8/2001 | Farooq et al. ............... 257/724 |
| 2001/0047588 | A1 | * | 12/2001 | Schaper ........................ 29/847 |
| 2002/0071258 | A1 | * | 6/2002 | Mosley ........................ 361/782 |
| 2002/0171997 | A1 | * | 11/2002 | Togashi et al. ........... 361/308.1 |

OTHER PUBLICATIONS

U.S. patent application Ser. No. 09/812,091, Farooq et al., filed Dec., 1999.*
Polka et al., "Package–Level Interconnect Design for Optimum Electrical Performance", Intel Technology Journal Q3, 2000, pp 1–17.
Mahajan et al., "The Evolution of Microprocessor Packaging", Intel Technology Journal Q3, 2000, pp 1–10.

* cited by examiner

Primary Examiner—Steven Loke
Assistant Examiner—Douglas W. Owens
(74) Attorney, Agent, or Firm—Fish & Richardson P.C.

(57) ABSTRACT

An apparatus includes a package having a first surface and a conductive contact exposed at the first surface. A capacitor is inside the package. The capacitor has a first conductive contact exposed at a first surface of the capacitor. The first conductive contact has a first portion spanning a width of the first surface of the capacitor. The first surface of the capacitor is substantially parallel to the first surface of the package. A conductive path connects the first portion of the first conductive contact of the capacitor to the first conductive contact proximate the first surface of the package.

30 Claims, 4 Drawing Sheets

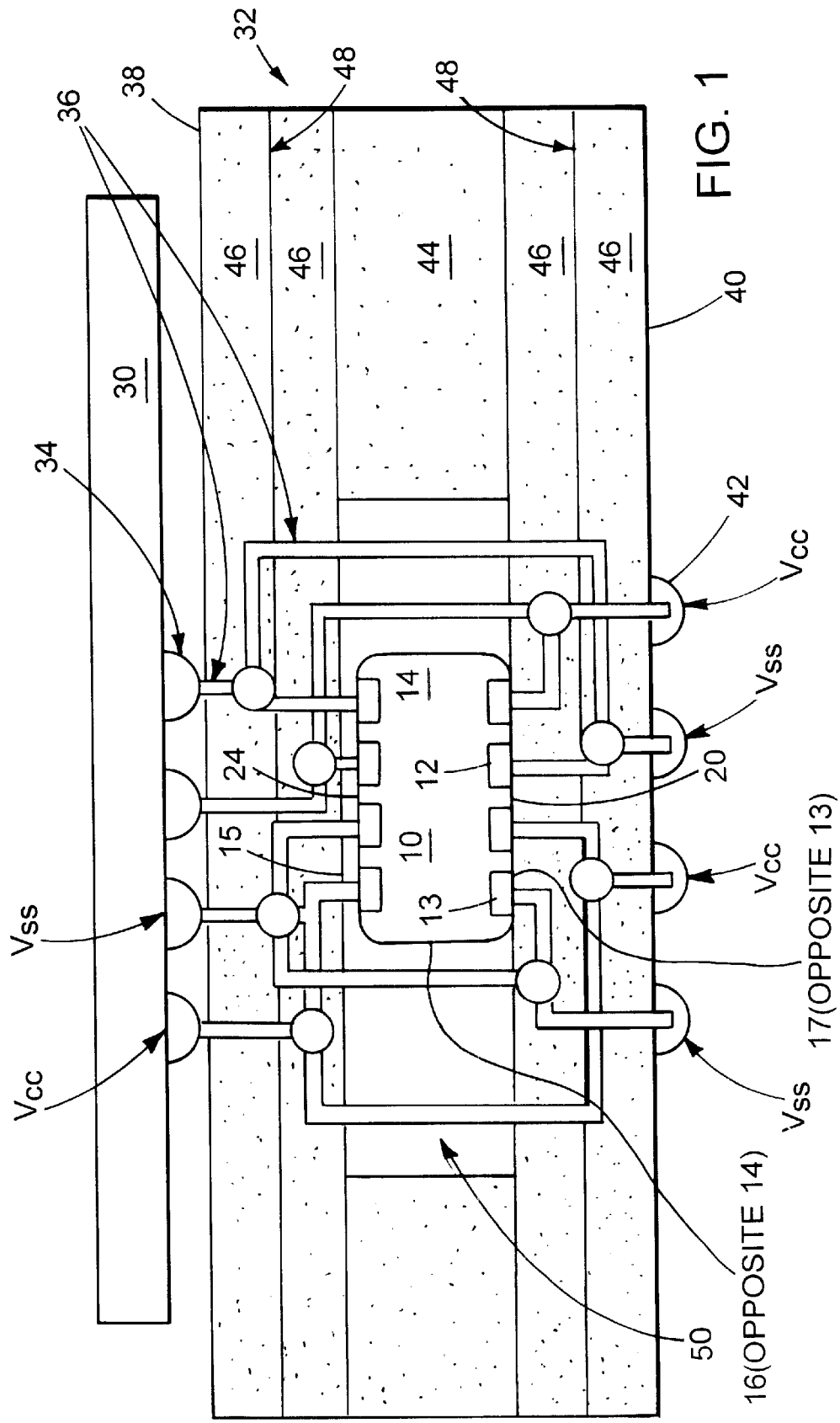

INTEGRATED CIRCUIT PACKAGE WITH A CAPACITOR

BACKGROUND

The invention relates to an integrated circuit package having a capacitor.

Decoupling capacitors, for example, are used to filter noise that is produced in computer circuits by inductive and capacitive parasitics of power supplies. Decoupling capacitors also may be used to dampen power system transients, for example, voltage overshoot or droop that occurs when a processor is shut down or powered up.

Decoupling capacitors also are used to provide supplemental current to a die's "hot spots", localized portions of a circuit die that require large amounts of current.

A decoupling capacitor's response time to a power system transient may be limited by impedance (e.g., inductance and resistance) between the decoupling capacitor and the die.

Decoupling capacitors may be surface mounted to a package upon which a die is mounted. Industry trends are directed to reducing device sizes and increasing packaging densities. Therefore, the amount of package real estate available to surface mount capacitors is becoming increasingly small.

BRIEF DESCRIPTION OF DRAWINGS

FIG. 1 is a cross-sectional view of a die mounted to a package with a capacitor.

DETAILED DESCRIPTION

Figure 2A:
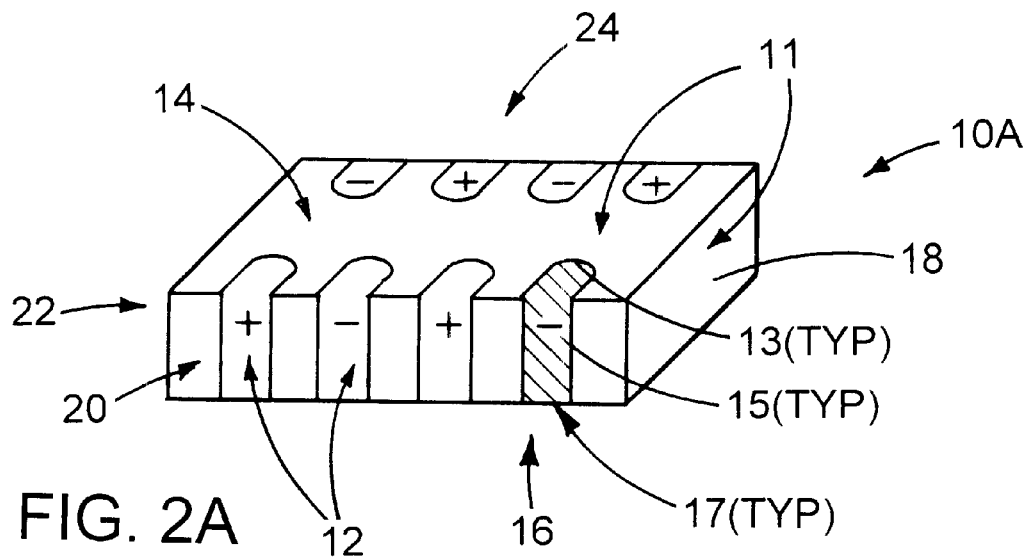
FIGS. 2A–2B are perspective views of capacitors.

As shown in FIG. 1, a package 32 has a first side 38 and a second side 40. A die 30 is mounted on the first side 38 of the package 32. The die 30 includes a silicon or other semiconductor substrate on which both active and passive components of an integrated circuit may be fabricated. The die 30 is supported by and electrically connected to vias 36 in the package 32 by die bumps 34, which serve as electrical contacts. Other electrical connections may be used instead of die bumps 34, such as wires. Vias 36 pass through the package 32 and electrically connect the die bumps 34 to contacts 12 on a capacitor 10 inside the package 32.

The capacitor 10 can be, for example, a low resistance, low inductance, multi-layer ceramic chip (MLCC) capacitor. The internal structure of MLCC capacitors typically includes multiple conductive layers insulated from each other. Each layer is typically connected to all of the contacts 12 on a capacitor 10 having a given polarity. Adjacent conductive layers are typically connected to opposite polarity contacts.

The capacitor 10 may have an industry standard form factor which identifies a capacitor's geometric size, shape, and weight. Other types of capacitors may be used.

Holes are typically drilled through the package 32 material. The walls of the holes may be plated with metal and filled with non-conductive epoxy to create the vias 36. Alternatively, the holes may be completely filled with conductive material to create the vias 36. The vias 36 provide conductive paths for the flow of current through the package 32.

The capacitor 10 can have four contacts 12 on each of two sides as shown, for a total of eight contacts. Each contact 12 completely spans one of two sides 20, 24 of capacitor 10 (see FIGS. 2A and 2B). The contacts 12 also partially span the top surface 14 and the bottom surface 16 of the capacitor 10.

The portion 15 of each contact 12 that spans the side surfaces 20, 24 are parallel to the first package side 38 next to the die bumps 34 and the second package side 40 next to package bumps 42. The package bumps 42 are electrical contacts that serve as connection points for power sources $V_{ss}$ and $V_{cc}$. Other conductive connections, for example, wires may be used in place of the package bumps 42.

The surface area of the portion 15 of each contact 12 that spans one of the side surfaces 20, 24 of the capacitor 10 can be greater than the surface area of the portion 13, 17 of the contact 12 that spans either the top surface 14 or the bottom surface 16 of the capacitor 10. Thus, multiple vias 36 can terminate at the portion 15 of each contact 12 that spans a side surface 20, 24 of the capacitor 10. Multiple vias 36 can be connected in parallel to create a low impedance connection between each of the die bumps 34, each of the contacts 12 on the capacitor 10 and each of the package bumps 42 as discussed in more detail with respect to FIG. 3.

Although the illustrated example can be used in complementary metal oxide semiconductor (CMOS) applications, other voltages and combinations of voltages may be used. For example, in gate turnoff logic (GTL) applications, $V_{ss}$ connections and ground connections are made to the package bumps 42.

The package 32 illustrated in FIG. 1 includes a core layer 44, four buildup layers 46, two conductive planes 48 and underfill 50. The design and arrangement of the different layers and components inside the package can vary. For example, the package 32 may contain more than one core layer 44. The core layer 44 is typically a preformed, reinforced, epoxy material, but may include other materials.

The package 32 may contain more or fewer buildup layers 46. Buildup layers 46 are formed of a material similar to core layer 44 material. Buildup layers 46 typically are not preformed, but are created by flowing epoxy onto a preformed core layer 44.

A package may contain one or more metal conductive planes 48. The underfill 50, which surrounds the capacitor 10, may be an epoxy-based material and should be resistant to cracking.

Figure 2B:
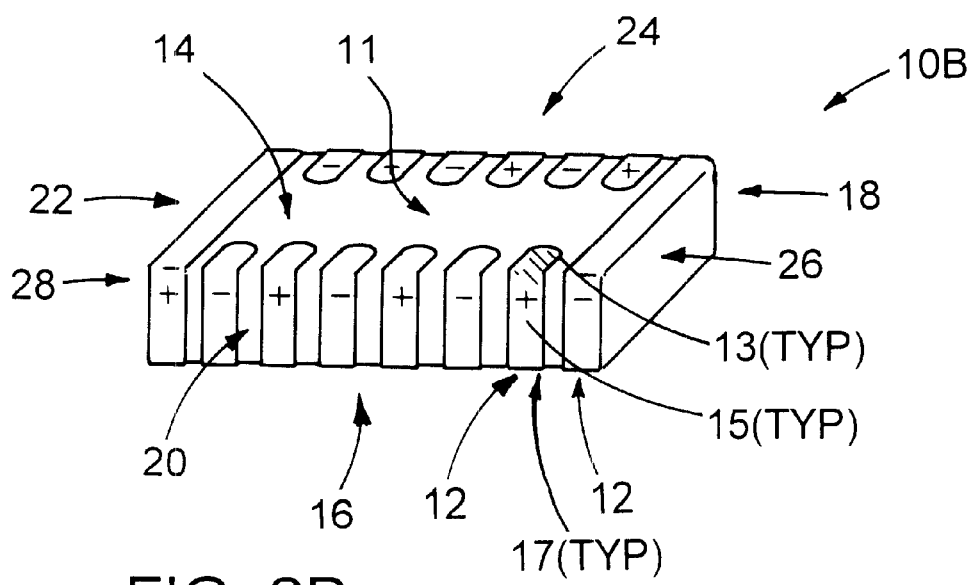

FIGS. 2A and 2B illustrate examples of capacitors that can be provided in the package 32 as described above. The capacitor 10A has a standard form factor and eight alternating polarity contacts 12. The term "alternating polarity" means that the polarity of each contact 12 is different from the polarity of adjacent contacts 12. For example, one contact might be connected to a 5-volt power source and an adjacent contact might be connected to a ground connection.

As shown in FIG. 2B, capacitor 10B includes fourteen alternating polarity contacts 12. In this example, the end caps 26 and 28 also serve as contacts.

Capacitors may have more or fewer contacts 12 and may have different relative spacing between the contacts 12. Adjacent contacts 12 on a single capacitor typically have different polarities, and contacts 12 are typically arranged on opposite sides of a capacitor. The body 11 of a capacitor is typically made of ceramic, but may be made of other materials.

Figure 3:
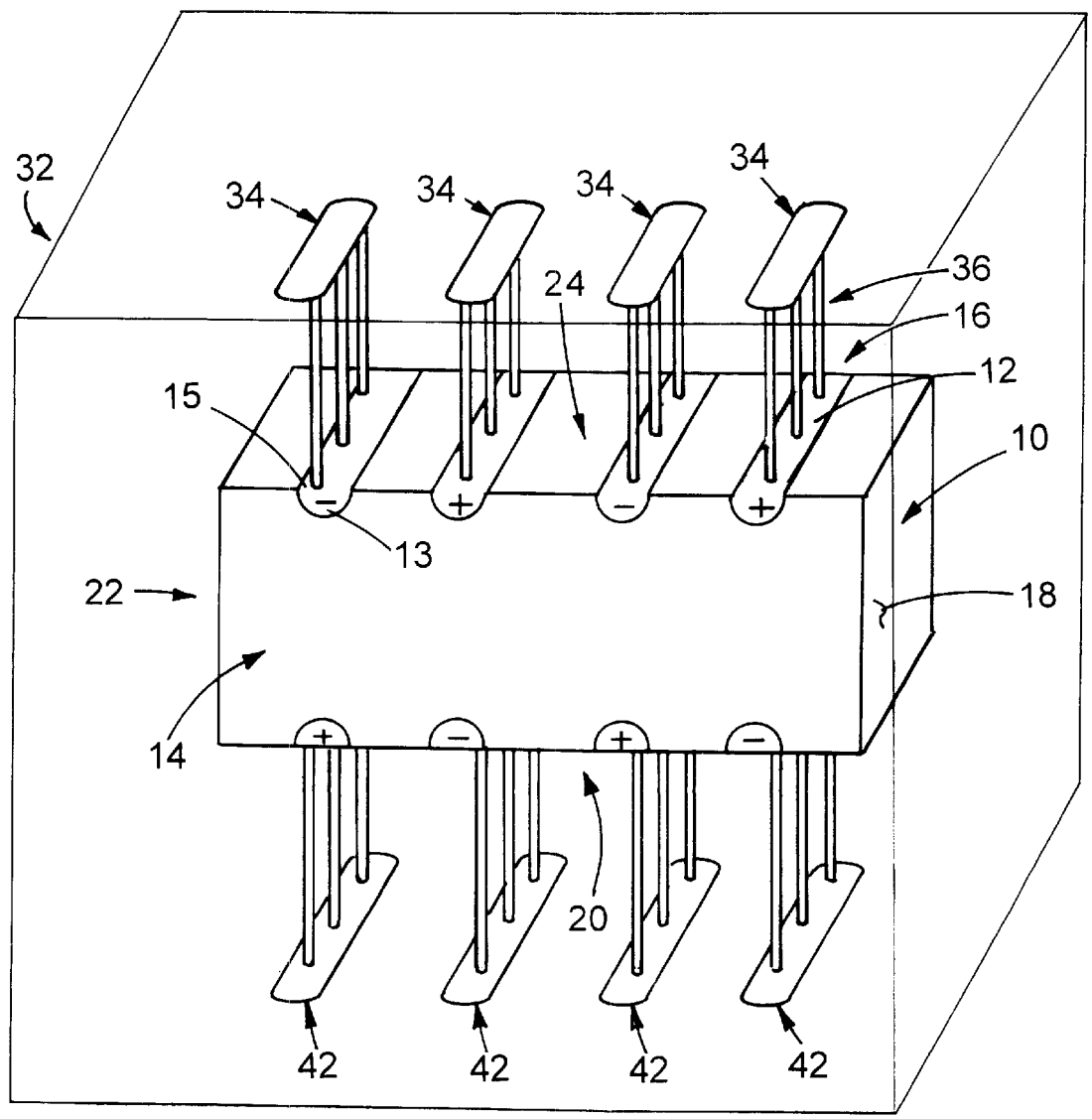
FIG. 3 is a perspective view of a capacitor in a package.

As shown in FIG. 3, each of the contacts 12 is connected to three vias 36. Each set of three vias 36 begins on one end at a single contact 12 and terminates at either a single die bump 34 or a single package bump 42. Generally, one or more vias 36 may be connected in parallel between each contact 12 on the capacitor 10 and each die bump 34 or package bump 42.

The maximum number of vias 36 that can be connected in this manner between a particular contact 12 and a particular die bump 34 or package bump 42 depends on the size of each via 36, the apparent surface area of the contact 12, and the apparent surface area of the particular die bump 34 or package bump 42. The term "apparent surface area" refers to the surface area of the portion of a contact 12, die bump 34, or package bump 42 that is substantially perpendicular to and in the path of one or more vias 36 that terminate on that point. The arrangement of FIGS. 1 and 3 provides a relatively large apparent surface area for the contacts 12. Thus, more vias 36 can be terminated at each contact 12.

Figure 4:
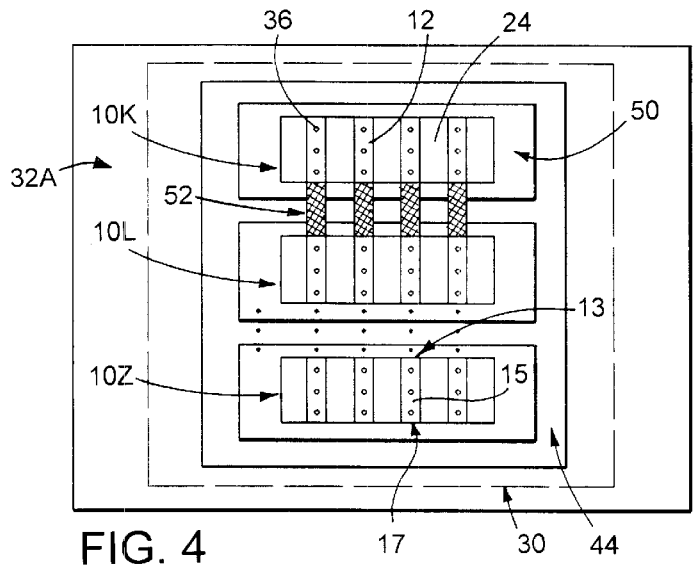
FIG. 4 is a sectional plan view of a package containing multiple capacitors.

As shown in FIG. 4, a package 32A contains multiple capacitors 10K, 10L . . . 10Z arranged side-by-side. Any number of capacitors 10K, 10L . . . 10Z can be configured as shown. A die 30, indicated by dashed lines, is mounted above the package 32A.

The contacts 12 of each capacitor 10K, 10L . . . 10Z can be electrically insulated from the contacts 12 of neighboring capacitors by underfill 50 material and/or core material 44. Alternatively, metal strips 52 may be formed directly on the core material 44 and underfill 50 to electrically connect contacts 12 of adjacent capacitors, such as shown for capacitors 10K and 10L. Similar connections can be made on the opposite side of the capacitors 10K and 10L. In that way the adjacent capacitors 10K and 10L can be connected in parallel.

Additional vias 36 may be terminated directly onto the metal strip 52. This can further increase the apparent surface area available for connecting vias 36 to a contact 12.

The package arrangement of FIG. 4 allows capacitors 10K, 10L . . . 10Z to be lined up in such a way that many capacitors can be fit in a particular size package 32A, and a relatively large capacitance can be obtained for a particular package size.

Figure 5:
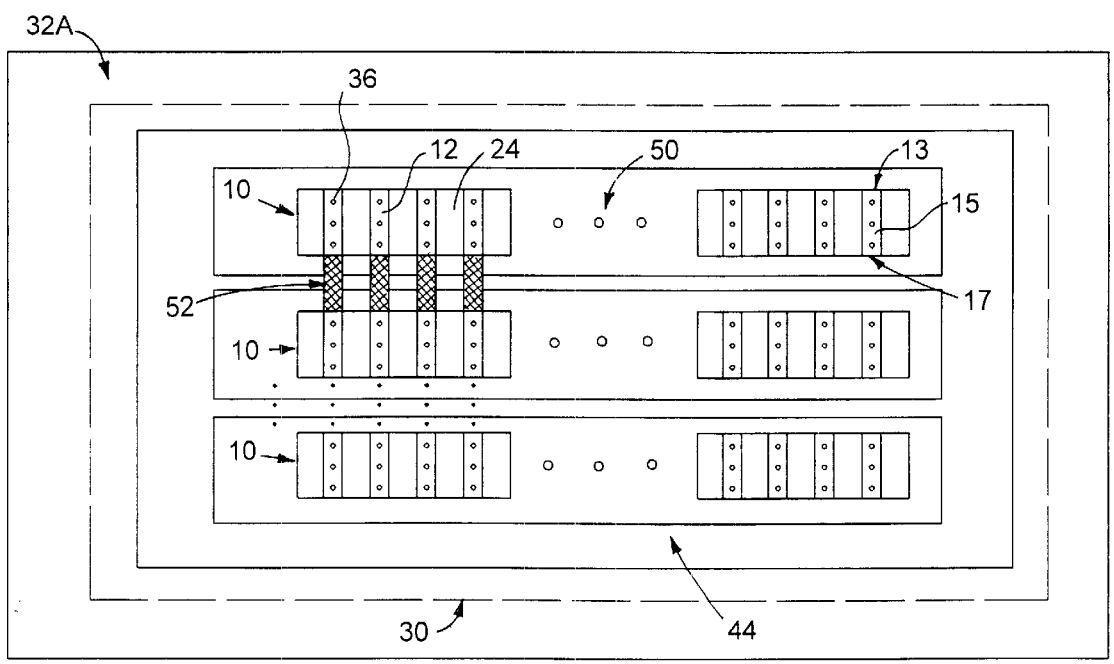
FIG. 5 is a sectional plan view of a package containing multiple capacitors.

As shown in FIG. 5, alternate embodiments may include capacitors 10 arranged in rows 60A, 60B . . . 60K and columns 70A . . . 70B.

The package 32 may provide one or more of the following advantages: higher capacitance, lower inductance and lower resistance between power supply connections and a die or other variable electrical load, and improved power system response to power system transient events.

Improved power system stability and better overall power integrity can be achieved. The package also may provide large values of capacitance in relatively small spaces. Smaller components can be manufactured, resulting in a more efficient use of space.

The package 32 can provide relatively low equivalent series inductance (ESL) and relatively low equivalent series resistance (ESR) conductive paths between a capacitor and a die. Additionally, the cost per unit of capacitance may be reduced because of the smaller amount of material needed to provide a particular capacitance.

Furthermore, manufacturing the package 32 can be relatively simple because the package can incorporate industry standard, readily available components.

Other implementations are within the scope of the following claims.

What is claimed is:

1. An apparatus comprising:
    a package having a first surface and a first external conductive contact exposed at the first surface;
    a capacitor inside the package, the capacitor having a first conductive contact exposed at a first surface of the capacitor, a first portion of the first conductive contact spanning a width of the first surface of the capacitor, the first surface of the capacitor being substantially parallel to the first surface of the package; and
    a first conductive path connecting the first portion of the first conductive contact of the capacitor to the first external conductive contact.

2. The apparatus of claim 1 comprising first conductive paths connecting in parallel the first portion of the first conductive contact of the capacitor to the first external conductive contact.

3. The apparatus of claim 1 comprising a second conductive path connecting the first portion of the first conductive contact of the capacitor to a first external conductive contact exposed at a second surface of the package substantially parallel to the first surface of the package.

4. The apparatus of claim 1 comprising second conductive paths connecting in parallel the first portion of the first conductive contact of the capacitor to a first external conductive contact exposed at a second surface of the package substantially parallel to the first surface of the package.

5. The apparatus of claim 1 comprising a second conductive path connecting a first portion of a second conductive contact spanning a second surface of the capacitor to a second external conductive contact exposed at the first surface of the package, the second surface of the capacitor being substantially parallel to the first surface of the package.

6. The apparatus of claim 1 comprising second conductive paths connecting in parallel a first portion of a second conductive contact spanning a second surface of the capacitor to a second external conductive contact exposed at the first surface of the package, the second surface of the capacitor being substantially parallel to the first surface of the package.

7. The apparatus of claim 1 comprising a second conductive path connecting a first portion of a second conductive contact spanning a second surface of the capacitor to a second external conductive contact exposed at a second surface of the package substantially parallel to the first surface of the package, the second surface of the capacitor being opposite the first surface of the capacitor.

8. The apparatus of claim 1 comprising second conductive paths connecting in parallel a first portion of a second conductive contact spanning a second surface of the capacitor to a second external conductive contact exposed at a second surface of the package substantially parallel to the first surface of the package, the second surface of the capacitor being opposite the first surface of the capacitor.

9. The apparatus of claim 1, the capacitor comprising third and fourth surfaces substantially perpendicular to the first and second surfaces of the capacitor, and each contact of the capacitor having a second portion that covers at least a part of the third surface of the capacitor and a third portion that covers at least a part of the fourth surface of the capacitor.

10. The apparatus of claim 9 wherein the second and third portions of each contact of the capacitor respectively have a surface area less than a surface area of the first portion of the contact.

11. The apparatus of claim 1 wherein the capacitor has an industry standard form factor.

12. The apparatus of claim 1 wherein the capacitor comprises a multi-layer ceramic chip capacitor.

13. An apparatus comprising:
a package having a first surface;
a die having a first conductive die contact proximate the first surface of the package;
a capacitor located inside the package, the capacitor having a first conductive contact exposed at a first surface of the capacitor, a first portion of the first conductive contact spanning a width of the first surface of the capacitor, the first surface of the capacitor being substantially parallel to the first surface of the package; and
a first conductive path connecting the first portion of the first conductive contact of the capacitor to the first conductive die contact.

14. The apparatus of claim 13 comprising first conductive paths connecting in parallel the first portion of the first conductive contact of the capacitor to the first conductive die contact.

15. The apparatus of claim 13 comprising a second conductive path connecting the first portion of the first conductive contact of the capacitor to a power supply.

16. The apparatus of claim 13 comprising second conductive paths connecting in parallel the first portion of the first conductive contact of the capacitor to a power supply.

17. The apparatus of claim 13 comprising a second conductive path connecting the first portion of the first conductive contact of the capacitor to a first external conductive contact exposed at a second surface of the package substantially parallel to the first surface of the package.

18. The apparatus of claim 13 comprising a second conductive path connecting a first portion of a second conductive contact spanning a width of a second surface of the capacitor to a second conductive contact of the die, exposed at the first surface of the package, the second surface of the capacitor being substantially parallel to the first surface of the package.

19. The apparatus of claim 13 comprising second conductive paths connecting in parallel a first portion of a second conductive contact spanning the width of a second surface of the capacitor to a second conductive contact of the die, exposed at the first surface of the package, the second surface of the capacitor being substantially parallel to the first surface of the package.

20. The apparatus of claim 13 comprising a second conductive path connecting a first portion of a second conductive contact spanning the width of a second surface of the capacitor to a power supply, the second surface of the capacitor being substantially parallel to the first surface of the package.

21. The apparatus of claim 13 comprising second conductive paths connecting in parallel a first portion of a second conductive contact spanning the width of a second surface of the capacitor to a power supply, the second surface of the capacitor being substantially parallel to the first surface of the package.

22. The apparatus of claim 13 comprising a second conductive path connecting a first portion of a second conductive contact spanning the width of a second surface of the capacitor to a second external conductive contact exposed at a second surface of the package, substantially parallel to the first surface of the package.

23. The apparatus of claim 13, the capacitor comprising third and fourth surfaces substantially perpendicular to the first and second surfaces of the capacitor, and each contact of the capacitor having a second portion that covers at least a part of the third surface of the capacitor and a third portion that covers at least a part of the fourth surface of the capacitor.

24. The apparatus of claim 23 wherein the second and third portions of each contact of the capacitor respectively have a surface area less than a surface area of the first portion of the contact.

25. The apparatus of claim 13 wherein the first and second conductive contacts of the capacitor are connected to different voltages.

26. The apparatus of claim 13 comprising conductive contacts on the first surface of the capacitor and conductive contacts on the second surface of the capacitor, wherein some of the contacts are connected to a first voltage and some of the contacts are connected to a second voltage.

27. An apparatus comprising:
a package having a first surface;
a die having conductive contacts exposed at the first surface of the package;
capacitors arranged side by side inside the package, each capacitor having a first conductive contact exposed at a first surface of the capacitor and a second conductive contact exposed at a second opposing surface of the capacitor, each conductive contact on each capacitor having a respective first portion that spans a width of the first or second surface of the capacitor, the first and second surfaces of each capacitor being substantially parallel to the first surface of the package; and
a first conductive path connecting the first portion of the first conductive contact of each capacitor to at least one of the conductive contacts on the die.

28. The apparatus of claim 27 comprising a second conductive path connecting the first portion of the first conductive contact of each capacitor to a power supply.

29. The apparatus of claim 27 comprising a second conductive path connecting the first portion of the second conductive contact of each capacitor to at least one of the conductive contacts of the die.

30. The apparatus of claim 27 comprising a second conductive path connecting the first portion of the second conductive contact of each capacitor to a power supply.

* * * * *